United States Patent [19]

Graziani

[11] 4,409,594

[45] Oct. 11, 1983

[54] APPARATUS FOR PERFORMING RADIO FREQUENCY PULSE MODULATION WITH AUTOMATIC MODULATION CONTROL

[75] Inventor: Danio Graziani, Milan, Italy

[73] Assignee: International Standard Electric Corporation, New York, N.Y.

[21] Appl. No.: 198,300

[22] Filed: Oct. 20, 1980

[30] Foreign Application Priority Data

Sep. 21, 1979 [IT] Italy ................................ 25913 A/79

[51] Int. Cl.³ .............................................. G01S 1/44
[52] U.S. Cl. ..................................... 343/399; 364/451
[58] Field of Search ...................... 332/9 R, 9 T, 31 R, 332/31 T, 37 R, 38, 37 D; 375/60; 455/126; 343/106 R; 364/451

[56] References Cited

U.S. PATENT DOCUMENTS 3,662,290  5/1972  Elliot .............................. 455/126 X
4,199,723  4/1980  Cummings et al. ............. 455/126 X
4,237,555  12/1980  Dishal ........................... 332/37 D X

*Primary Examiner*—Siegfried H. Grimm
*Assistant Examiner*—Edward P. Westin
*Attorney, Agent, or Firm*—T. E. Kristofferson; W. T. O'Neil

[57] ABSTRACT

A modulator for RF class C amplifiers particularly suitable for transistor power stages employing FAIL-SOFT. Automatic modulation control operates to independently adjust the gains of a pair of controllable amplifiers whose outputs are then combined, filtered and applied to a class C stage. The output of the class C stage is sampled, linearly detected and processed to produce gain control time-voltage functions which compensate for class C pulse distortion so that a preserved amplified waveshape can be obtained.

10 Claims, 6 Drawing Figures

APPARATUS FOR PERFORMING RADIO FREQUENCY PULSE MODULATION WITH AUTOMATIC MODULATION CONTROL

BACKGROUND OF THE INVENTION

1. Field of the Invention

The invention relates generally to modulators and more specifically to those for Class C, RF pulse amplifiers using transistor amplifier stages with "FAIL-SOFT".

2. Description of the Prior Art

Pulse modulation of transistor RF power stages is known to present various problems. One such problem is that of modulation linearity i.e., the modulated stage's ability to accurately reproduce the shape of video modulation signal on the envelope of an RF signal. Another problem is the spectrum generated as a result of modulation, specifically the problem of maintaining within the system prescribed limits. Both aforementioned problems are often complicated by the RF carrier frequency, the instantaneous bandwidth, temperature and the high magnitude currents involved, particularly where power levels are relatively high. In such applications as DME and TACAN equipment, pulse shape and spectrum occupied at RF are of critical importance.

This manner in which the invention deals with the aforementioned problems will be seen as this description proceeds.

SUMMARY

The invention is basically a system for preshaping a modulator pulse so that nonlinearities inherent in a class C RF amplifier (solid state for example) are compensated so that a desired modulated RF envelope shape can be achieved. The RF pulse envelope is linearly detected from a sample of the RF amplifier output, and the envelope width, at two (or more) levels of amplitude is monitored and converted into corresponding discrete control signals. A pair of gain-controllable amplifiers (where two envelope levels, such as 10% and 90% are being monitored ) are provided. One of these amplifiers is fed a substantially square pedestal or base pulse and the other is fed a narrower substantially square pulse substantially centered with respect to the pedestal pulse. The control corresponding to the envelope width at 90% amplitude is used to control the gain of a video pulse amplifier receiving the narrower square pulses and a second video pulse amplifier receiving the pedestal pulse is gain-controlled by a second control signal, which is a function of the envelope width at the 10% amplitude point. The outputs of these amplifiers are additively mixed in a combined circuit so that a stacked pulse effect is achieved with independent control of the two stacked components of the stacked pulse.

Filtering is included to form a pulse of lower spectral content (a Gaussian shape for example) than represented in the stacked square pulses.

The system is thus a pulse preformation arrangement controlled by feedback from the detected RF envelope so that non-linearity of the class C RF amplifier is relatively inconsequential.

The details of a typical embodiment employing the invention are hereinafter described.

DETAILED DESCRIPTION OF THE PREFERRED EMBODIMENT

Figure 1:
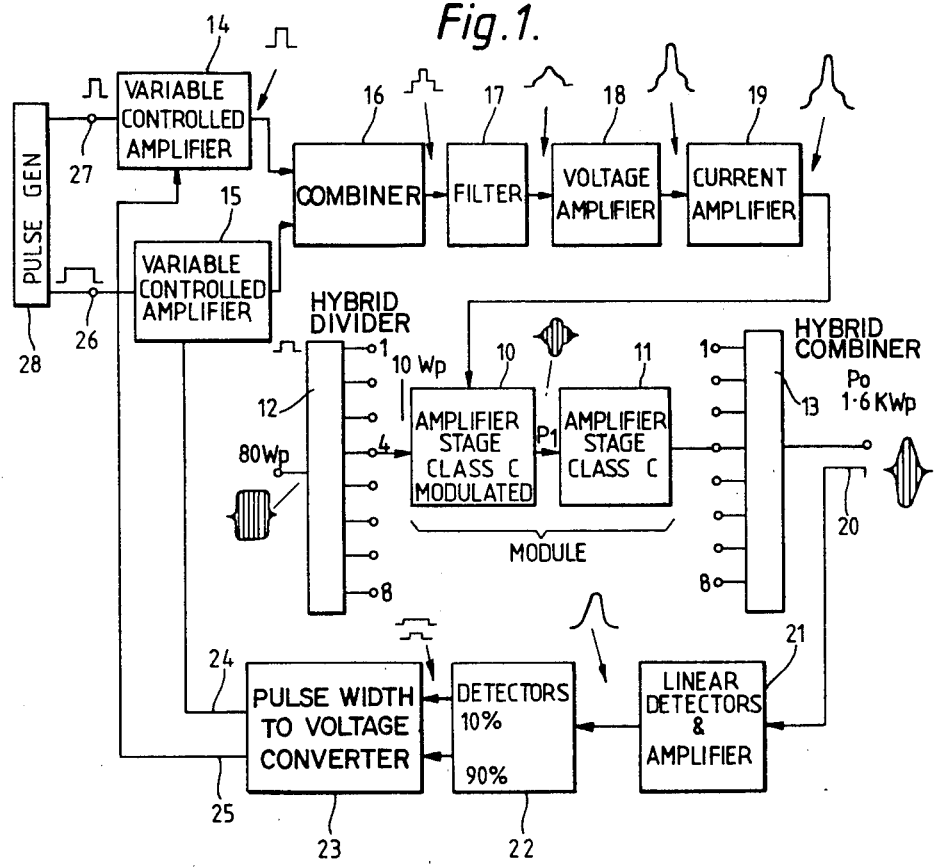
FIG. 1 is a schematic block diagram of a typical arrangement according to the invention.

Referring to FIG. 1, the block diagram of a pulse transmitter employing transistor power amplifiers assumed to operate at L band and being modulated with Gaussian pulses. This is a typical transmitting format for DME and TACAN.

Figure 2:
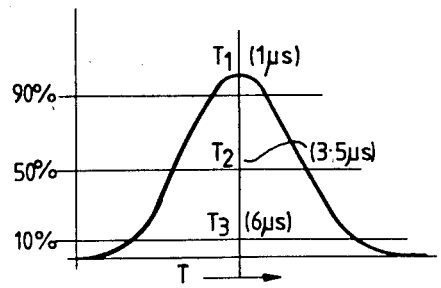
FIG. 2 is a waveform of a typical RF envelope from the linear detector of FIG. 1.
Figure 3:
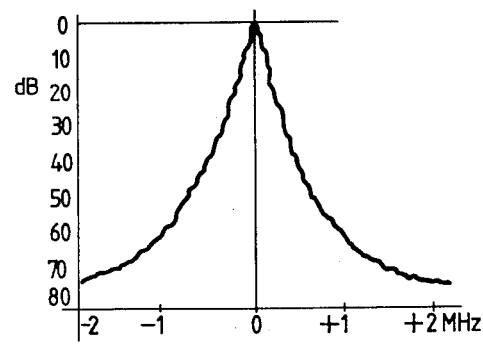
FIG. 3 is a spectral plot of the RF pulse envelope of FIG. 2.

An RF band of operation is typically 960 to 1215 MHz, and a typical peak output power is 1.6 KW, this being obtained by paralleling of 8×200W amplifier (solid state) modules connected through 9 port hybrids 12 and 13 at the input and output respectively. Each module may be fed by an RF carrier signal itself pulse-modulated (for power dissipation conservation) coincidentially with the Gaussian modulation pulses at 10W peak power. Each module is typically composed of two cascade stages 10 and 11, each using a power transistor. Only the lower level stage 10 is modulated (for pulse shaping) on its transistor collector. Stage 11 is unmodulated and amplifies the signals of stage 10, delivering at its output, the signal correctly modulated with the Gaussian pulse, the spectrum being within the prescribed limits, as shown in FIGS. 2 and 3. The class C amplifier module of 10 and 11 is repeated for each hybrid terminal, i.e. eight such modules are employed in the arrangement of FIG. 1, between hydrids 12 and 13 corresponding terminals 1–8.

Figure 4:
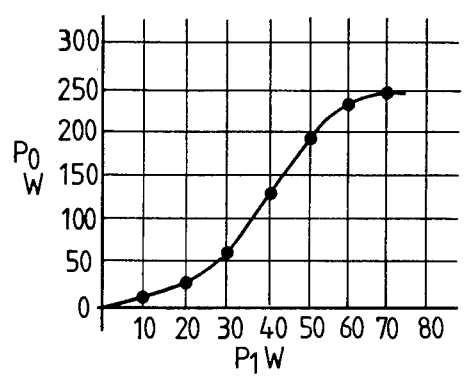
FIG. 4 is a plot of the variation of instantaneous output power of a class C RF amplifer (as employed in FIG. 1) as a function of instantaneous input power.
Figure 5:
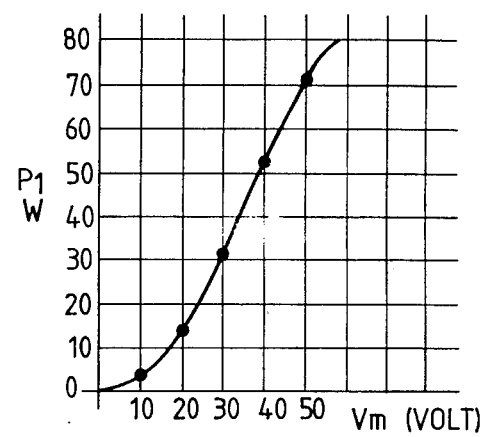
FIG. 5 illustrates the variation of instantaneous output power of a RF amplifier as a function of instantaneous modulator signal amplitude.
Figure 6:
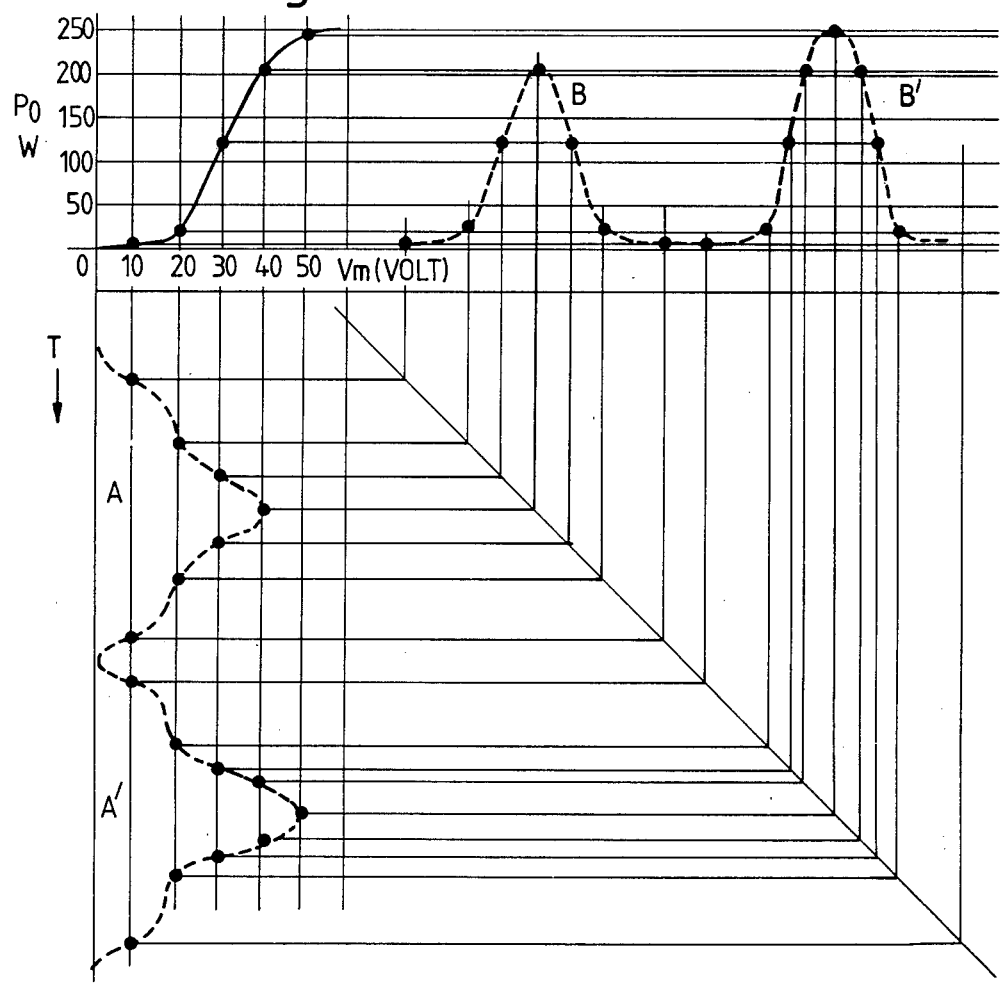
FIG. 6 is a composite graph illustrating the modulation driving pulse shape (A, A') required to produce the Gaussian output pulses (B, B') through a transfer characteristic as depicted in FIG. 4.

FIG. 4 shows the typical variation of the output power of unmodulated stage 11 in relation to input power, whereas FIG. 5 shows the typical variations of output power of stage 10 in relation to the modulation voltage on the transistor collector (Vm). FIG. 6 shows the combination of both curves: it may be noted that, to obtain the correct output pulse form B, the pulse must be preshaped as in A. It is also to be noted that, to avoid the saturation phenomena in A' and B', modulation must not be pushed beyond a certain limit, and therefore the output power obtainable cannot be the maximum, but must be held to a slightly lower value.

It will be seen from FIG. 1 how a preshaped pulse is obtained. That preshaped pulse is the combination of two coinciding pulses, one to form the "pedestal", i.e. the lower wider part of the preshaped pulse, and the other, the upper narrower part, the two stacked to form the Gaussian pulse (after filtering in 17). Both pulses 26 and 27 are generated by a conventional circuit 28 and amplified separately in square form so that each amplitude, and therefore the combined amplitude are adjustable. After additive mixing in combiner 16, the stacked pulses are filtered in low-pass filter 17 to attenuate the spectral components not desired. Amplifiers 18 and 19 then serve to provide the modulation signal to 10 at an appropriate power level.

The RF signal shapes at the input and the output of stages 1 and 2 are depicted directly on FIG. 1. It can be seen that the output signal from stage 10 includes a part of the pedestal, but that this disappears in the output signal of stage 11. By adjusting the gains of amplifiers 10 and amplifier 11, the modulation pulse may be shaped to obtain at the output of stage 11 the pulse of FIG. 2 having the spectrum of FIG. 3. In particular, by adjusting the level of the pedestal only, the pulse's Gaussian base is gradually widened, with a consequent effect on spectrum content. When correcting the level of the superimposed narrow pulse, one essentially modifies only the peak until the maximum achievable instantaneous power is reached, which, as previously mentioned, must be slightly below the saturation maximum, otherwise the pulse shape corresponding to peak is flattened, causing pulse deformation and consequent spectrum deterioration.

The curves of FIGS. 4 and 5, and consequently that in FIG. 6, move with frequency, and therefore Vm may assume different instantaneous values. Furthermore, temperature and circuit aging may affect both the Vm and the level, shape and spectrum of the output signal.

Continuing with the description of FIG. 1, the RF signal output is sampled by a coupler 20, and this small signal is linearly detected and amplified in 21. This process accurately reproduces the Gaussian pulses of the transmitted envelopes. These demodulated signals are applied to a circuit 22 which constantly examines its duration at 90% and 10% of its maximum amplitude and supplies the two signals proportional to pulse duration. That circuit 22 is sometimes referred to as a threshold detector. Subsequently, these signals are transformed into proportional control voltage (or currents) in pulse-width-to-voltage converter 23, which by means of easily implemented and well known circuits, cause gain variations in amplifiers 14 and 15 (90% and 10%, respectively). The result is a constant, precise, efficient automatic modulation control (AMC).

The time constant of control, effecting the gain variation in amplifier 14 and 15 is such as to effect a correction in a few milliseconds, a correction rate suitable for DME or TACAN purposes. It will be realized that a more rapid correction rate (or slower one) could be provided for another application. The variations are sensed by continually analyzing the output signal in the feedback loop of FIG. 1. Action is therefore continuous and only slightly delayed without affect on the regular performance of amplifiers 14 and 15. As already mentioned, if, for any reason (change in signal frequency, temperature, component setting), there is a pulse shape variation which provokes a deviation in duration times at the 10% and 90% points, the AMC automatically corrects it, resetting the original, preset time values. At the same time, the spectrum is also automatically corrected, since, as mentioned, the pulse shape, especially the base (pedestal) shape, has a notable effect on the spectral distribution. Therefore, besides compensating frequency change variations, this current confers stability and reliability to the modulated amplifier in terms of pulse shape, spectrum and power.

Another interesting advantage of the AMC technique of the invention is that modulation may be automatically set at the point corresponding to the start of stage saturation, i.e. the point at which the maximum stage power is obtained. In fact, when the AMC is suitably set, it is possible to adjust the 90% time in order to correspond to the start of the saturation area (maximum power). This effect is illustrated in FIG. 6.

The foregoing means that the AMC of the invention be preset in such a way that, independently of any operator adjustment, the amplifier will be automatically preset so that, for a change in frequency or any other disturbance, the maximum power together with the desired signal shape and the spectrum are automatically provided. In the so-called "FAIL-SOFT" technique amplifiers, many parallel modules are employed. Failure of one or more modules can be tolerated, with little effect on the parameters of the amplified signal except power. Obviously a power loss is inevitable, but more importantly the transmitter remains in service. Since the AMC circuit and concepts of this invention are not sensitive to power level variation, nor to the number of pulses per second, but only to variations in signal times, it is therefore particularly suitable for "FAIL-SOFT" transmitting equipment at unattended or minimally attended sites.

What is claimed is:

1. A radio-frequency pulse transmitting system such as DME or Tacan comprising:
   first means including at least one radio-frequency amplifier responsive on a radio-frequency input to a pulse-modulated carrier signal and to a further-frequency video pulse on a control terminal for producing radio-frequency output pulses having predetermined envelope characteristics;
   second means for discretely sampling said radio-frequency output pulses at a plurality of amplitude levels and for generating discrete modulation control signals each representing the duration of the envelope of said radio-frequency output pulses at a predetermined corresponding amplitude level;
   third means for generating a plurality of separate video pulse trains synchronous with and of pulse duration not exceeding the pulses of said pulse-modulated carrier signal;
   fourth means comprising a separate gain-controllable amplifier responsive to each of said second means modulation control signals and to a corresponding one of said third means video pulses to adjust the amplitude of said corresponding video pulse as a function of the corresponding control signal from said second means;
   and fifth means for combining said video pulses from said third means to provide a train of pulses having peak amplitude substantially equal to the sum of the amplitudes of said video pulses from said third means, said combined pulse train being applied at said radio-frequency amplifier as said further-modulating pulse.

2. A system according to claim 1 in which said pulse-modulated carrier signal applied to said first means has a substantially rectangular envelope and in which said system includes a low-pass filter responsive to said combined video pulses for shaping said combined video pulses prior to their application to said radio-frequency amplifier as said further-modulating video pulses.

3. A system according to claim 1 in which said first means includes a plurality of paralleled radio-frequency amplifier modules and input and output hybrid circuits are provided for dividing said pulse-modulated carrier signal among the input terminals of said modules and for combining the power outputs of said modules to form said radio-frequency output pulses, said control terminals of said modules being connected in parallel from the output of said fifth means.

4. An automatic modulation control system for RF pulse transmitting equipment such as DME or TACAN including an RF amplifier receiving a pulsed carrier signal input, comprising the combination of:
- a source of at least two synchronous trains of pulses of different duration, said pulses of said pulse train which are of lesser duration falling within the duration of said pulses which are of greater duration;
- at least two gain-controllable pulse amplifiers, a corresponding one of said amplifiers being discretely responsive to each of said synchronous pulses;
- a pulse combiner responsive to the outputs of said gain-controllable pulse amplifiers to additively combine said trains of synchronous pulses, thereby forming a train of combination pulses;
- first means for impressing said train of combination pulses into said RF amplifier to produce correspondingly modulated RF pulses;
- second means for sampling said RF pulses and for detecting and outputting the envelope thereof;
- third means responsive to said second means for generating a discrete control signal as a function of the duration of said envelope for each of a plurality of predetermined amplitude levels of said envelope;
- and fourth means for applying said control signals, one to each of said gain-controllable amplifiers discretely in order corresponding to the highest-to-lowest values of said envelope amplitude levels, to said controllable amplifiers corresponding to said synchronous pulses of shortest-to-largest duration, respectively.

5. A system according to claim 4 including low-pass filter means within said first means to reduce the spectrum represented in said combination pulse.

6. A system according to claim 5 in which said RF amplifier is of the class C type, said modulation control system compensating for distortions and variations of the shape and therefore the spectral characteristics of said RF pulse, including distortions and variations introduced by said class C amplifier.

7. A system according to claim 4 in which said predetermined amplitude levels of said envelope are two in number corresponding to 90 and 10 percent of maximum envelope amplitude and said synchronous pulse trains, said gain-controllable pulse amplifiers and said control signals are each two in number.

8. A system according to claim 4 in which said synchronous pulse trains, control signals and gain-controllable amplifiers are each two in number and in which said predetermined levels of said envelope are the 90 and 10 percent amplitude levels thereof, said control signal derived in said third means corresponding to said RF pulse duration at its 90 percent amplitude being applied to said gain-controllable amplifier responsive to the shorter duration one of said synchronous pulses, and said control signal derived in said third means corresponding to said RF pulse duration at its 10 percent amplitude being applied to said gain-controlled amplifier responsive to the longer duration one of said synchronous pulses.

9. A system according to claim 6 in which said class C amplifier includes a plurality of solid state amplifier modules responsive in parallel to the output of said low-pass filter and having inputs connected to a source of RF excitation through an input power divider and outputs combined in an output power divider, said class C amplifier thereby affording continued operation at reduced power notwithstanding failure of a small number of said modules.

10. A system according to claim 4 in which said second means detecting means is a linear detector.

* * * * *

UNITED STATES PATENT OFFICE
CERTIFICATE OF CORRECTION

PATENT NO. : 4,409,594
DATED : October 11, 1983
INVENTOR(S) : Danio Graziani

It is certified that error appears in the above-identified patent and that said Letters Patent are hereby corrected as shown below:

In claim 1, line 30, "frequency" should be ---modulating---

Signed and Sealed this

Twenty-seventh Day of December 1983

[SEAL]

Attest:

GERALD J. MOSSINGHOFF

Attesting Officer    Commissioner of Patents and Trademarks